(12) United States Patent
Chinthu

(10) Patent No.: US 12,512,838 B2
(45) Date of Patent: Dec. 30, 2025

(54) SINGLE-STAGE AND MULTI-STAGE VOLTAGE LEVEL SHIFTERS

(71) Applicant: GlobalFoundries U.S. Inc., Malta, NY (US)

(72) Inventor: Siva Kumar Chinthu, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 237 days.

(21) Appl. No.: 18/350,294

(22) Filed: Jul. 11, 2023

(65) Prior Publication Data
US 2025/0023565 A1  Jan. 16, 2025

(51) Int. Cl.
*H03K 19/0185* (2006.01)
(52) U.S. Cl.
CPC .......................... *H03K 19/018521* (2013.01)
(58) Field of Classification Search
None
See application file for complete search history.

(56) References Cited

U.S. PATENT DOCUMENTS

| 4,149,232 | A | 4/1979 | Eaton, Jr. |
| 5,059,815 | A | 10/1991 | Bill et al. |
| 5,436,587 | A | 7/1995 | Cernea |
| 5,734,286 | A | 3/1998 | Takeyama et al. |
| 6,028,473 | A | 2/2000 | Kamei et al. |
| 6,046,626 | A | 4/2000 | Saeki et al. |
| 6,046,627 | A | 4/2000 | Itoh et al. |
| 6,099,100 | A | 8/2000 | Lee |
| 6,160,723 | A | 12/2000 | Liu |
| 6,191,963 | B1 | 2/2001 | McPartland et al. |
| 6,356,469 | B1 | 3/2002 | Roohparvar et al. |
| 6,392,905 | B1 | 5/2002 | Huang et al. |
| 6,483,728 | B1 | 11/2002 | Johnson et al. |
| 6,525,949 | B1 | 2/2003 | Johnson et al. |

(Continued)

FOREIGN PATENT DOCUMENTS

EP  4072015 A1  12/2022

OTHER PUBLICATIONS

Extended European Search Report for Corresponding EP Application No. 24151286.2-1201 dated Jun. 14, 2024, 11 pages.

(Continued)

*Primary Examiner* — Cassandra F Cox
(74) *Attorney, Agent, or Firm* — David Cain; Hoffman Warnick LLC

(57) ABSTRACT

Disclosed structures include a single-stage and a multi-stage voltage level shifter. Each structure includes multiple transistors, which are optionally all symmetric low-voltage transistors, and the structures are configured to avoid operation outside the safe operating area (SOA) of such transistors. The single-stage voltage level shifter and the first stage of the multi-stage voltage level shifter can be essentially identical. In operation, input voltage pulses (including an input voltage pulse transitioning between a first positive voltage (V1) equal to the voltage rating of the transistors and ground) can be received at source nodes of N-type transistors and, in response, output voltage pulses (including an intermediate output voltage pulse transitioning between V1 and a second positive voltage (V2) that is higher than (e.g., double) V1 and an output voltage pulse that transitions between ground and V2) can be output.

18 Claims, 8 Drawing Sheets

(56) References Cited

U.S. PATENT DOCUMENTS

| | | | |
|---|---|---|---|
| 6,570,434 | B1 | 5/2003 | Hsu et al. |
| 6,747,897 | B2 | 6/2004 | Karaki |
| 6,819,162 | B2 | 11/2004 | Pelliconi |
| 6,922,096 | B2 | 7/2005 | Cernea |
| 6,995,603 | B2 | 2/2006 | Chen et al. |
| 7,116,156 | B2 | 10/2006 | Myono et al. |
| 7,710,183 | B2 | 5/2010 | Chaba et al. |
| 8,049,553 | B2 | 11/2011 | Kim et al. |
| 8,476,963 | B2 | 7/2013 | Cook et al. |
| 8,963,624 | B2 | 2/2015 | Murakami |
| 9,013,229 | B2 | 4/2015 | Rahman et al. |
| 9,160,930 | B2 | 10/2015 | Ishii |
| 9,306,450 | B2 | 4/2016 | Emira et al. |
| 9,548,655 | B2 | 1/2017 | Ersoy et al. |
| 10,355,694 | B1 | 7/2019 | Kumar |
| 10,498,230 | B1 | 12/2019 | Chen et al. |
| 10,911,047 | B1 * | 2/2021 | Shetty .............. H03K 3/356182 |
| 11,139,004 | B2 | 10/2021 | Sinha et al. |
| 11,277,121 | B1 | 3/2022 | Goyal et al. |
| 11,569,738 | B1 | 1/2023 | Chinthu |
| 11,671,080 | B1 * | 6/2023 | Ross .............. H03K 19/018507 327/333 |
| 11,843,374 | B2 | 12/2023 | Lee |
| 2008/0012627 | A1 | 1/2008 | Kato |
| 2009/0134929 | A1 | 5/2009 | Luo |
| 2010/0309716 | A1 | 12/2010 | Tsukada |
| 2010/0327959 | A1 | 12/2010 | Lee |
| 2014/0132329 | A1 | 5/2014 | Li et al. |
| 2019/0379365 | A1 | 12/2019 | Hsu et al. |
| 2025/0023564 | A1 | 1/2025 | Chinthu et al. |
| 2025/0023566 | A1 | 1/2025 | Chinthu et al. |

OTHER PUBLICATIONS

U.S. Appl. No. 18/350,327, Notice of Allowance dated Jan. 27, 2025, 8 pages.
U.S. Appl. No. 18/350,316, Notice of Allowance dated Apr. 4, 2025, 9 pages.
U.S. Appl. No. 18/350,316, Office Action dated Oct. 9, 2024, 12 pages.
U.S. Appl. No. 18/350,316, Final Office Action dated Mar. 10, 2025, 13 pages.
U.S. Appl. No. 18/350,305, filed Jul. 11, 2023, 38 pages.
U.S. Appl. No. 18/350,316, filed Jul. 11, 2023, 47 pages.
U.S. Appl. No. 18/350,327, filed Jul. 11, 2023, 59 pages.
U.S. Appl. No. 18/350,316, Amendment to Office Action filed Dec. 9, 2024, 15 pages.
U.S. Appl. No. 18/350,305, Office Action dated Apr. 17, 2025, 10 pages.
U.S. Appl. No. 18/350,305, Amendment to Office Action filed Apr. 24, 2025, 13 pages.
Ballo et al., "A Review of Charge Pump Topologies for the Power Management of IoT Nodes," MDPI Electronics, 8, 480, 2019, pp. 1-15.
Cavalheiro et al., "Insights into Tunnel FET-Based Charge-Pumps and Rectifiers for Energy Harvesting Applications," IEEE Transactions on Very Large Scale Integration (VLSI) Systems, vol. 25, Issue 3, 2017, pp. 1-11.
Chen et al., "A Sub-100mV Ultra-Low Voltage Level-Shifter Using Current Limiting Cross-Coupled Technique for Wide-Range Conversion to I/0 Voltage," IEEE Access, vol. 8, published Aug. 6, 2020, pp. 145577-145585.
Lanuzza et al., "Low-Power Level Shifter for Multi-Supply Voltage Designs," IEEE Transactions on Circuits and Systems—II: Express Briefs, vol. 59, No. 12, Dec. 2012, pp. 922-926.
Pan et al., "A Low Voltage to High Voltage Level Shifter Circuit for MEMS Application," IEEE, In Proceedings of the 15th Biennial University/Government/Industry Microelectronics Symposium, Jul. 2003, pp. 128-131.
Pelliconi et al., "Power Efficient Charge Pump in Deep Submicron Standard CMOS Technology," IEEE Journal of Solid-State Circuits, vol. 38, No. 6, Jun. 2003, pp. 1068-1071.
U.S. Appl. No. 17/488,380, Office Action dated Apr. 28, 2022, 11 pages.
U.S. Appl. No. 17/488,380, Response to Office Action submitted May 27, 2022, 19 pages.
U.S. Appl. No. 17/488,380, Final Office Action dated Aug. 31, 2022, 13 pages.
U.S. Appl. No. 17/488,380, Response to Final Office Action submitted Sep. 26, 2022, 21 pages.
U.S. Appl. No. 17/488,380, 2nd After Final Response dated Oct. 5, 2022, 10 pages.
U.S. Appl. No. 17/488,380, Advisory Action dated Oct. 5, 2022, 17 pages.
U.S. Appl. No. 17/488,380, Notice of Allowance dated Oct. 21, 2022, 9 pages.
U.S. Appl. No. 18/350,305, Notice of Allowance dated Jun. 3, 2025, 10 pages.

* cited by examiner (E.g., 1.8V transistors, GND=0.0V, V1=1.8V, V2=3.6V, GND=0.0V)

(E.g., 1.8V transistors, GND=0.0V, V1=1.8V, V2=3.6V, V3=5.4V, etc.)

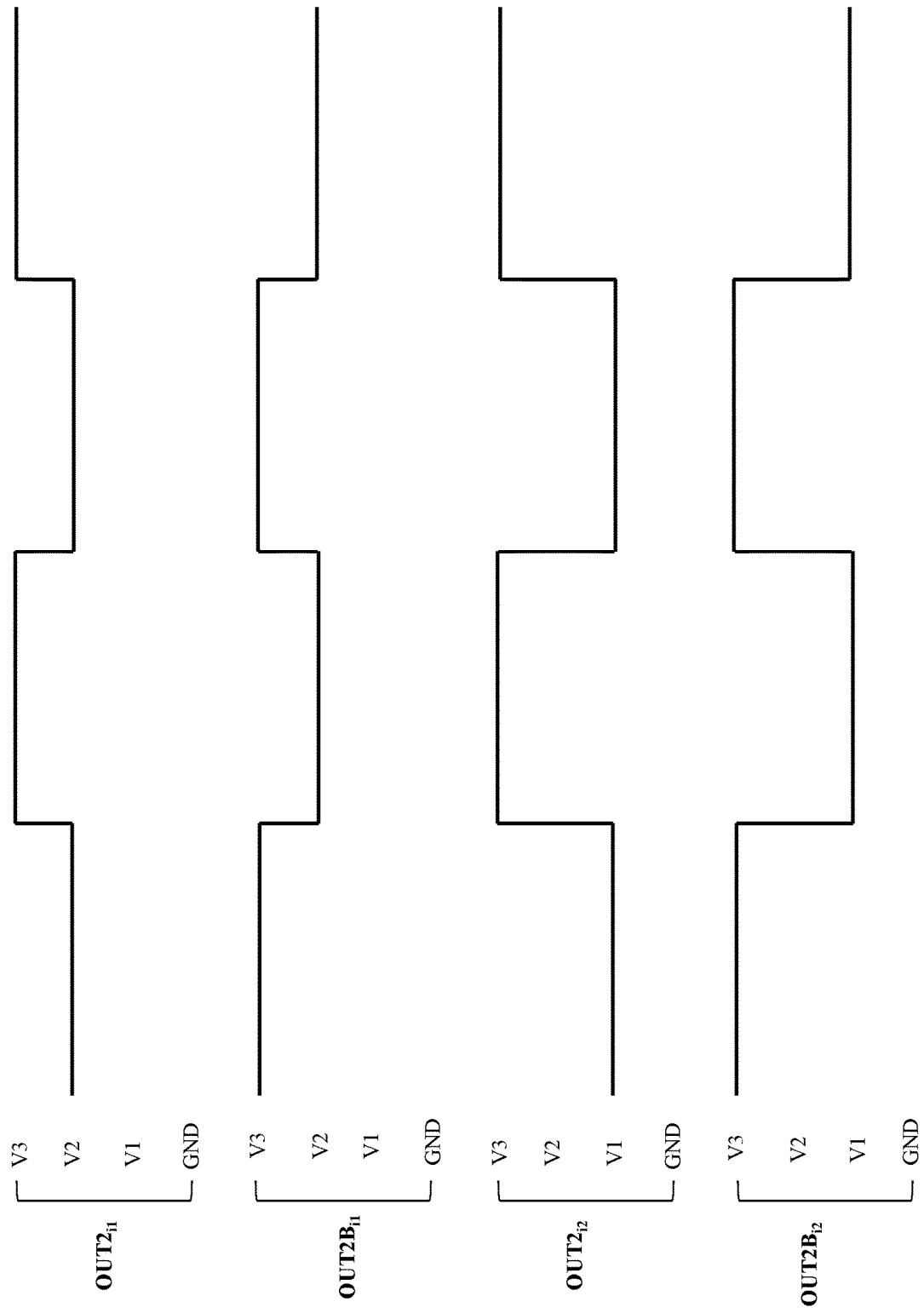

(E.g., 1.8V transistors, GND=0.0V, V1=1.8V, V2=3.6V, V3=5.4V, etc.)

SINGLE-STAGE AND MULTI-STAGE VOLTAGE LEVEL SHIFTERS

BACKGROUND

The present disclosure relates to on-chip voltage level shifters and, more particularly, to embodiments of single-stage and multi-stage voltage level shifters.

Considerations in modern integrated circuit (IC) design include, but are not limited to, performance improvement, size scaling, and power consumption. Oftentimes design changes to improve one aspect of the design can yield an undesirable trade-off with respect to one or more of the other aspects of the design. For example, a voltage level shifter in an IC design may be configured to translate (i.e., shift) a voltage signal from one logic level or voltage domain to another. Voltage level shifter designs have been developed that include low voltage transistors to reduce power consumption. However, at least some of the low voltage transistors in these voltage level shifters tend to quickly operate outside the safe operating area (SOA). Design modifications intended to avoid operation outside the SOA have included, for example, the use of asymmetric high voltage transistors (e.g., laterally diffused metal oxide semiconductor field effect transistors (LDMOSFETs)) in place of at-risk low voltage transistors and/or the use of a discrete biasing circuit. While such design modifications may work to avoid operation outside the SOA, they also add to circuit complexity, power consumption, and area.

SUMMARY

Disclosed herein are embodiments of a structure and, particularly, a voltage level shifter circuit structure. The structure can include a first voltage rail at a first positive voltage and a second voltage rail at a second positive voltage that is higher than (e.g., essentially double) the first positive voltage. The structure can further include a voltage level shifter connected to the first voltage rail and the second voltage rail. The voltage level shifter can be configured to receive multiple input voltage pulses and to output multiple output voltage pulses. The input voltage pulses can include an input voltage pulse that transitions between the first positive voltage and ground. The output voltage pulses can include: an intermediate output voltage pulse that transitions between the first positive voltage and the second positive voltage; and a final output voltage pulse that transitions between ground and the second positive voltage.

In some embodiments disclosed herein, the structure can specifically include a single-stage voltage level shifter. In these embodiments, the structure can include a first voltage rail at a first positive voltage and a second voltage rail at a second positive voltage that is higher than (e.g., essentially double the magnitude of) the first positive voltage. The structure can further include a voltage level shifter connected to the first voltage rail and the second voltage rail. The voltage level shifter can include two input nodes and four output nodes. The voltage level shifter can further include two N-type transistors having source regions connected to the input nodes, respectively, and further having gates connected to receive the first positive voltage. The voltage level shifter can be configured to receive two input voltage pulses at the input nodes, respectively, and to output four output voltage pulses at the output nodes, respectively. The input voltage pulses can include an input voltage pulse, which transitions between the first positive voltage and ground, and an inverted input voltage pulse, which transitions from ground to the first positive voltage when the input voltage pulse transitions from the first positive voltage to ground and vice versa. The output voltage pulses can include an intermediate output voltage pulse, which transitions between the first positive voltage and the second positive voltage, and an inverted intermediate output voltage pulse, which transitions from the second positive voltage to the first positive voltage when the intermediate output voltage transitions from the first positive voltage to the second positive voltage and vice versa. The output voltage pulses can also include a final output voltage pulse, which transitions between ground and the second positive voltage, and an inverted final output voltage pulse, which transitions from the second positive voltage to ground when the final output voltage pulse transitions from ground to the second positive voltage and vice versa.

In other embodiments, the structure can specifically include a multi-stage voltage level shifter. In these embodiments, the structure can include multiple voltage rails including at least: a first voltage rail at a first positive voltage; a second voltage rail at a second positive voltage that is higher than (e.g., essentially double the magnitude of) the first positive voltage; and a third voltage rail at a third positive voltage that is higher than the second positive voltage (e.g., essentially triple the first positive voltage). The structure can further include a voltage level shifter with multiple voltage shifting stages. These stages can at least include: a first voltage shifting stage connected to the first voltage rail and the second voltage rail and a second voltage shifting stage connected to the second voltage rail and the third voltage rail. The first voltage shifting stage can be configured to receive multiple first input voltage pulses and to output multiple first output voltage pulses. The first input voltage pulses can include a first input voltage pulse that transitions between the first positive voltage and ground. The first output voltage pulses can include an intermediate first output voltage pulse that transitions between the first positive voltage and the second positive voltage and a final first output voltage pulse that transitions between ground and the second positive voltage. The second voltage shifting stage can receive the first output voltage pulses and can output second output voltage pulses. These second output voltage pulses can include at least an intermediate second output voltage pulse that transitions between the second positive voltage and the third positive voltage, an additional intermediate second output voltage pulse that transitions between the first positive voltage and the third positive voltage, and a final second output voltage pulse that transitions between ground and the third positive voltage.

BRIEF DESCRIPTION OF THE DRAWINGS

The present disclosure will be better understood from the following detailed description with reference to the drawings, which are not necessarily drawn to scale and in which:

FIGS. 6A-6C are timing diagrams illustrating input voltage pulses to and output voltage pulses from the second voltage shifting stage of FIG. 5.

DETAILED DESCRIPTION

Figure 1:
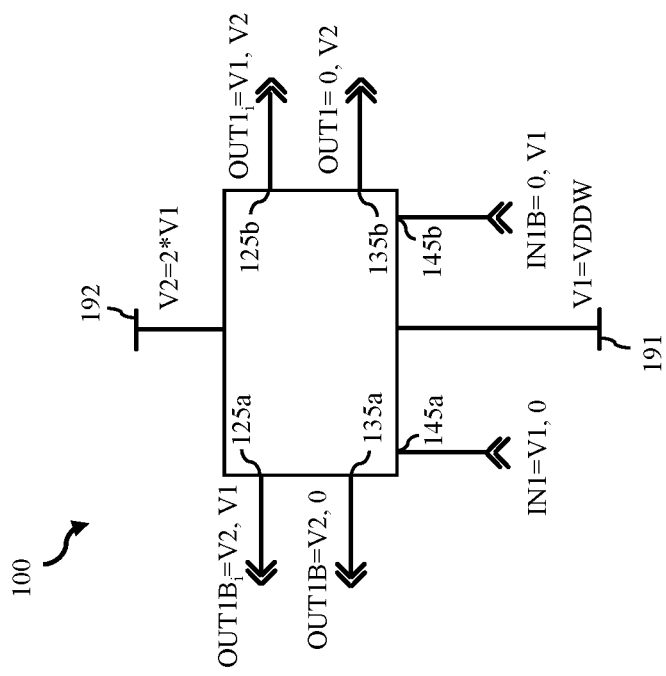
FIG. 1 is a schematic diagram illustrating an embodiment of a single-stage voltage level shifter (or, alternatively, a first stage of a multi-stage voltage level shifter)

As mentioned above, considerations in modern integrated circuit (IC) design include, but are not limited to, performance improvement, size scaling, and power consumption. Oftentimes design changes to improve one aspect of the design can yield an undesirable trade-off with respect to one or more of the other aspects of the design. For example, a voltage level shifter in an IC design may be configured to translate (i.e., shift) a voltage signal from one logic level or voltage domain to another. Voltage level shifter designs have been developed that include low voltage transistors, such as 2.0V transistors or lower (e.g., 1.8V transistors, 1.5V transistors, 0.8V transistors, etc.), to reduce power consumption. However, at least some of the low voltage transistors in these voltage level shifters tend to quickly operate outside the safe operating area (SOA). Those skilled in the art will recognize that the SOA refers to the maximum time a transistor (e.g., a metal oxide semiconductor field effect transistor (MOSFET)) can be exposed to a specific voltage and current (e.g., a drain current (ID) and drain-source voltage (VDS) in case of a MOSFET, etc.). To avoid operation outside the SOA and thereby avoid device stress than can lead to early device failure, the data sheet for a given MOSFET will specify, for example, a maximum operating VDS, a maximum operating gate-source voltage (VGS), and a maximum operating gate-drain voltage (VGD). Voltage level shifter designs that include all low voltage transistors are typically unable to achieve the desired voltage level shift without violating at least one of these maximums in at least one of the low voltage transistors. Design modifications intended to avoid operation outside the SOA have included, for example, the use of asymmetric high voltage transistors (e.g., laterally diffused metal oxide semiconductor field effect transistors (LDMOSFETs)) in place of at-risk low voltage transistors and/or the use of a discrete biasing circuit. While such design modifications may work to avoid operation outside the SOA, they also add to circuit complexity, power consumption, and area.

In view of the foregoing, disclosed herein are embodiments of a structure including a single-stage voltage level shifter or a multi-stage voltage level shifter. The single-stage voltage level shifter or a first voltage shifting stage of the multi-stage voltage level shifter can be connected to both a first positive voltage rail at a first positive voltage (V1) and a second positive voltage rail at a second positive voltage (V2) that is essentially double the magnitude of first positive voltage V1. The voltage level shifter can further be configured to receive multiple input voltage pulses (including an input voltage pulse that transitions between V1 and ground (e.g., at 0 volts) and to output multiple output voltage pulses (including an intermediate output voltage pulse that transitions between voltages V1 and V2 and a final output voltage pulse that transitions between ground and V2). In a multi-stage voltage level shifter, each downstream stage can receive, as inputs, outputs voltage pulses from the previous stage and can similarly output multiple output voltage pulses (as discussed in greater detail below). The voltage level shifter can, for example, include all low voltage (V) transistors (e.g., 3.3V transistors or lower, such as a 1.8V, 1.5V, or 0.8V transistors) and these transistors can all be designed to be symmetric (absent any process variations) in order to reduce both power consumption and circuit complexity while still avoiding operation outside the SOA.

Figure 2:
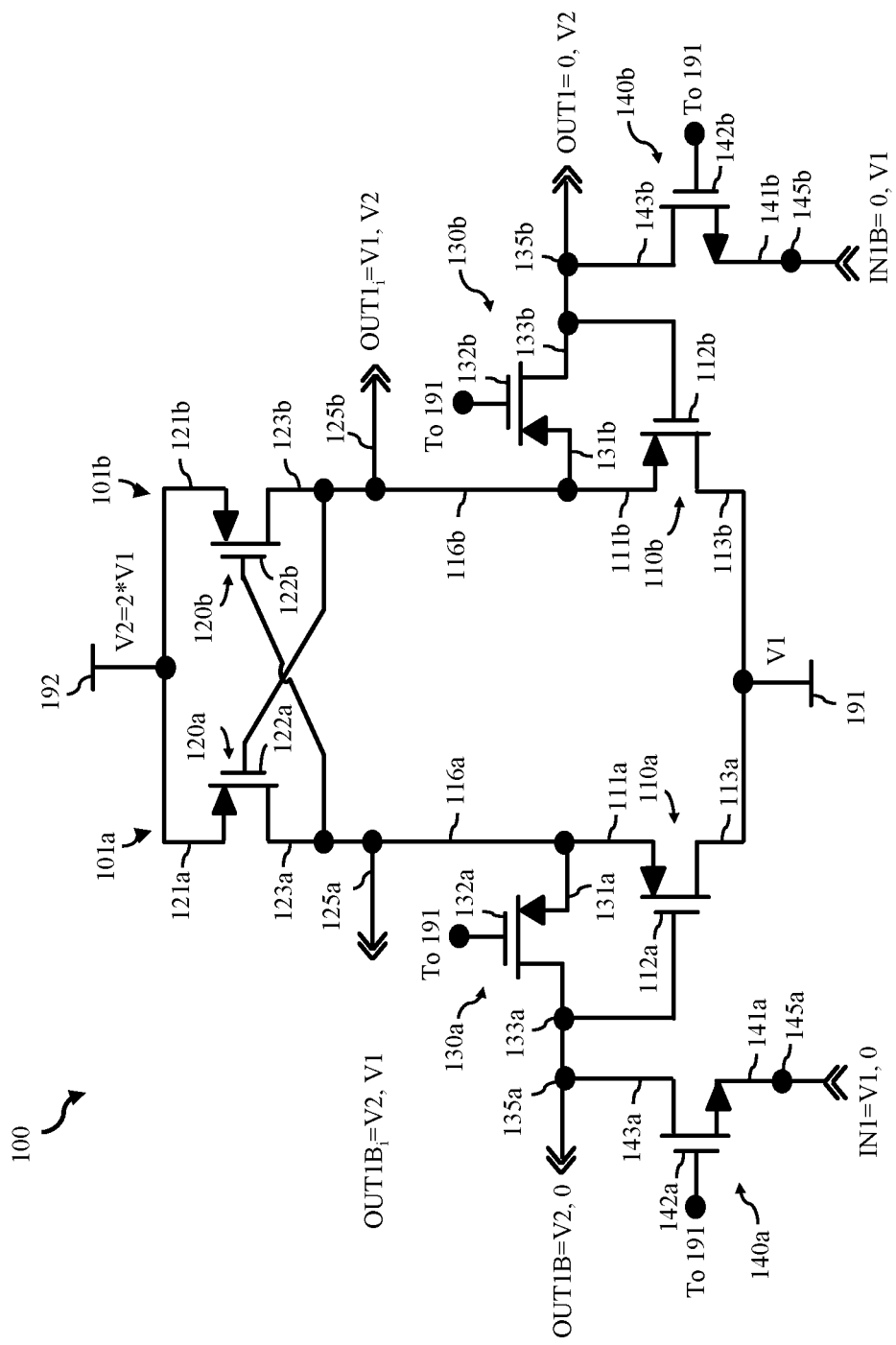
FIG. 2 is a schematic diagram illustrating in greater detail the structure of FIG. 1.

More particularly, FIG. 1 is a schematic diagram generally illustrating embodiments of a circuit structure 100 and FIG. 2 is a schematic diagram illustrating a specific embodiment of the circuit structure 100. This circuit structure 100 can be a stand-alone single-stage voltage level shifter, as illustrated in FIGS. 1 and 2. Alternatively, as discussed in greater detail below and illustrated generally in FIG. 4, the circuit structure 100 can be the first voltage shifting stage of a multi-stage voltage level shifter 400.

Figure 4:
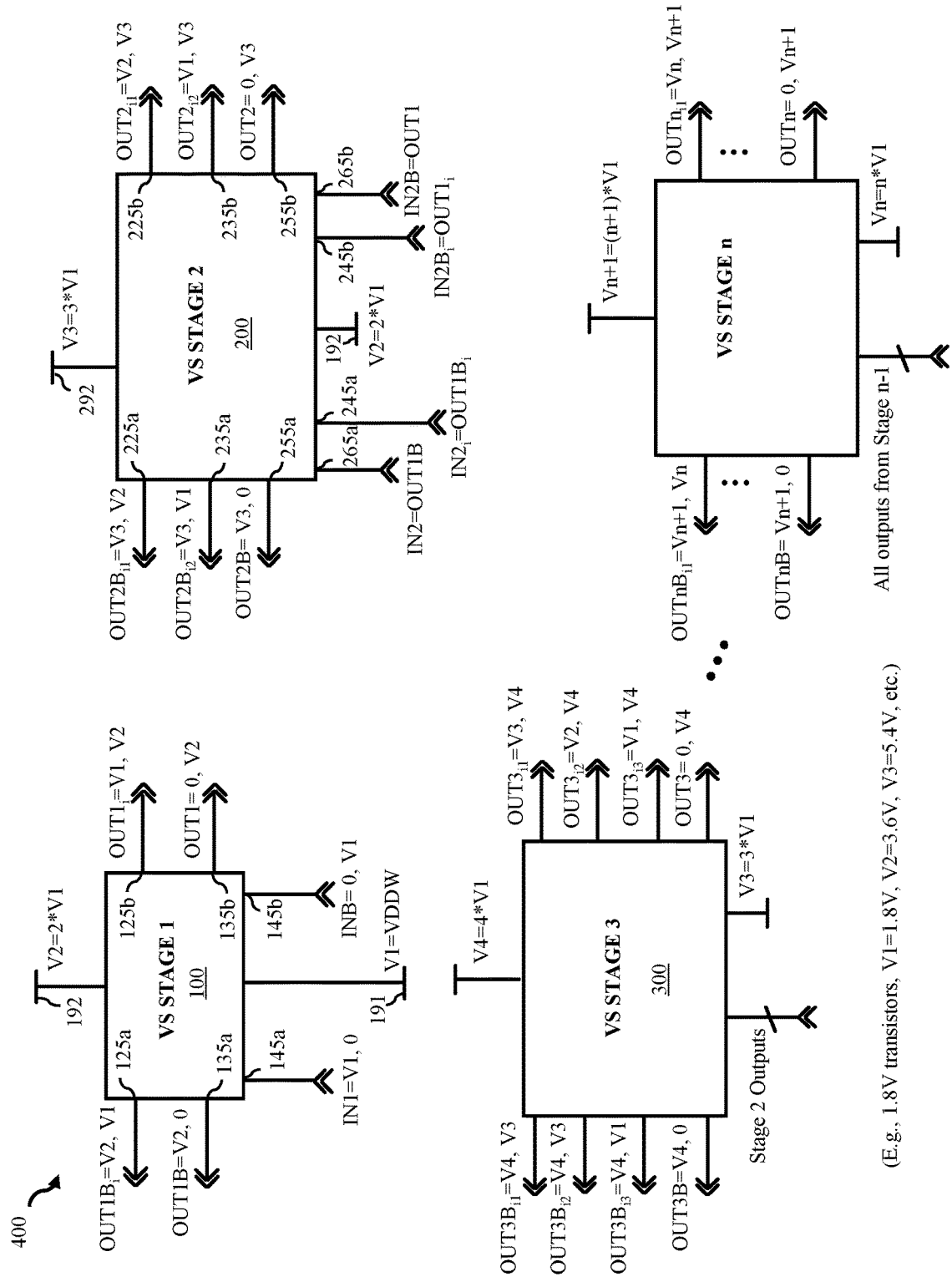
FIG. 4 is a schematic diagram illustrating an embodiment of a multi-stage voltage level shifter.

Circuit structure 100 (which as mentioned above can be either a single-stage voltage level shifter, as shown in FIG. 1, or the first voltage shifting stage of a multi-stage voltage level shifter 400, as shown in FIG. 4) can include multiple transistors. As discussed in greater detail below, these transistors can include both P-type transistors and N-type transistors. For purposes of illustration, the P-type transistors and N-type transistors are described below and illustrated in the figures as being metal oxide semiconductor field effect transistors (MOSFETs) and, particularly, P-type field effect transistors (PFETs) and N-type field effect transistors (NFETs), respectively. A MOSFET refers to a transistor with a semiconductor channel region positioned laterally between a source region and a drain region and with a gate (e.g., including a gate dielectric-gate conductor stack) adjacent to the channel region. However, it should be understood that the figures and discussion thereof are not intended to be limiting. For example, alternatively, a similar circuit structure could be formed using bipolar junction transistors (BJTs) and, particularly, PNP BJTs and NPN BJTs.

The transistors can all have the same maximum voltage rating and, for reduced power consumption, that maximum voltage rating (VDDW) can be relatively low as specified by the transistor data sheet. For example, the transistors can have a maximum voltage rating of 3.3 volts (V) or lower. In some embodiments, the transistors can have a maximum voltage rating of 1.8V, 1.5V or 0.8V. To minimize manufacturing complexity, the transistors can all be symmetric. That is, they can be designed so that the source region and the drain region are the same (e.g., same size, doping, etc.) except for minor process variations and so that the same maximum voltage rating applies to the gate-source voltage (VGS), the gate-drain voltage (VGD), and the drain-source voltage (VDS). As discussed in greater detail below, the circuit structure 100 can further be configured to achieve voltage level shifting without violation of any of these maximum voltage ratings and, thus, avoiding device stress and ensuring operation within the SOA.

Specifically, circuit structure 100 can be electrically connected to a first voltage rail 191 at a first positive voltage (V1). V1 can specifically be set so that it is equal to the maximum voltage rating (VDDW) of the transistors. The circuit structure 100 can further be electrically connected to a second voltage rail 192 at a second positive voltage (V2). V2 can be higher than V1 and, more particularly, can be essentially double the magnitude of V1. For purposes of this disclosure, "essentially double" the magnitude refers to twice the magnitude, plus or minus 10% thereof (e.g., if V1 is 1.8V, then V2=3.6V+/−. 36V, etc.). Thus, for example, if the maximum voltage rating of the transistors is 1.8V, then V1 can be set at 1.8V and V2 can be set at 3.6V. If the maximum voltage rating is 1.5V, then V1 can be set at 1.5V and V2 can be set at 3.0V. If the maximum voltage rating is 0.8V, then V1 can be set at 0.8V and V2 can be set at 1.6V. circuit structure 100 can include two input nodes 145*a* and 145b and four output nodes, including two intermediate output nodes 125a-125b and two final output nodes 135a-135b.

The circuit structure 100 can be connected to receive two input voltage pulses at the two input nodes and, particularly, to receive an input voltage pulse (IN1), which transitions between V1 and ground (e.g., at 0 volts), at input node 145a and to receive an inverted input voltage pulse (IN1b), which is inverted with respect to IN1 and, thus, which transitions from ground to V1 as IN1 transitions from V1 to ground and vice versa, at input node 145b. The circuit structure 100 can further be configured to generate and output four different output voltage pulses including two intermediate output voltage pulses at intermediate output nodes 125a-125b and two final output voltage pulses at final output nodes 135a-135b. The two intermediate output voltage pulses can include intermediate output voltage pulse ($OUT1_i$), which transitions between V1 and V2, at intermediate output node 125b and inverted intermediate output voltage pulse ($OUT1B_i$), which is inverted with respect to $OUT1_i$ and, thus, which transitions from V2 and V1 as OUT1i transitions from V1 to V2 and vice versa, at intermediate output node 125a. The two final output voltage pulses can include final output voltage pulse (OUT1), which transitions between ground and V2, at a final output node 135b and inverted final output voltage pulse (OUT1B), which is inverted with respect to OUT1 and, thus, which transitions from V2 to ground as OUT1 transitions from ground to V2 and vice versa, at final output node 135a.

For purposes of this disclosure, a "voltage pulse" refers to an essentially rectangular direct current voltage signal that transitions between a low voltage level and a high voltage level at regular and repeated intervals such that the pulse is at the low voltage level for a first time period (t1), switches to the high voltage level and remains at the high voltage level for a second time period (t2) (which is the same as or different from t1), switches back to the low voltage level and again remains at the low voltage level for t1, and so on.

Referring to the schematic diagram of FIG. 2, in some embodiments the circuit structure 100 can include symmetric branches 101a-101b connected in parallel between the first voltage rail 191 and the second voltage rail 192.

Each branch 101a, 101b can include a first PFET 110a, 110b and a second PFET 120a, 120b connected in series between first voltage rail 191 and second voltage rail 192. That is, first PFET 110a, 110b can include a drain region 113a, 113b electrically connected to first voltage rail 191, a gate 112a, 112b, and a source region 111a, 111b. Second PFET 120a, 120b can include a drain region 123a, 123b electrically connected to source region 111a, 111b of first PFET 110a, 110b, a gate 122a, 122b, and a source region 121a, 121b electrically connected to second voltage rail 192. In some embodiments, source region 111a, 111b of first PFET 110a, 110b and drain region 123a, 123b of the second PFET 120a, 120b can be a share source/drain region. In other embodiments, source region 111a, 111b of the first PFET 110a, 110b and drain region 123a, 123b of the second PFET 120a, 120b could be discrete regions electrically connected by an interconnect.

Each branch 101a, 101b can further include an intermediate output node 125a, 125b and a third PFET 130a, 130b electrically connected to a junction 116a, 116b between first PFET 110a, 110b and second PFET 120a, 120b. Third PFET 130a, 130b can specifically include: a source region 131a, 131b, which is electrically connected to junction 116a, 116b between first PFET 110a, 110b and second PFET 120a, 120b; a drain region 133a, 133b, which is electrically connected to a final output node 135a, 135b and also to gate 112a, 112b of first PFET 110a, 110b, and a gate 132a, 132b, which is electrically connected to, e.g., first voltage rail 191, so as to receive V1.

Additionally, the second PFET 120a of branch 101a and second PFET 120b of branch 101b can be cross coupled. That is, gate 122a of second PFET 120a in branch 101a can be electrically connected to junction 116b between first PFET 110b and second PFET 120b in branch 101b, while gate 122b of second PFET 120b in branch 101b can be electrically connected to junction 116a between first PFET 110a and second PFET 120a in branch 101a.

Finally, each branch 101a, 101b can further include an NFET 140a, 140b (also referred to herein as a pass-gate NFET). NFET 140a, 140b can include: a source region 141a, 141b, which is electrically connected to an input node 145a, 145b; a drain region 143a, 143b, which is electrically connected to final output node 135a, 135b (and thereby electrically connected to the drain region 133a, 133b of third PFET 130a, 130b as well as gate 112a, 112b of first PFET 110a, 110b).

Figure 3:
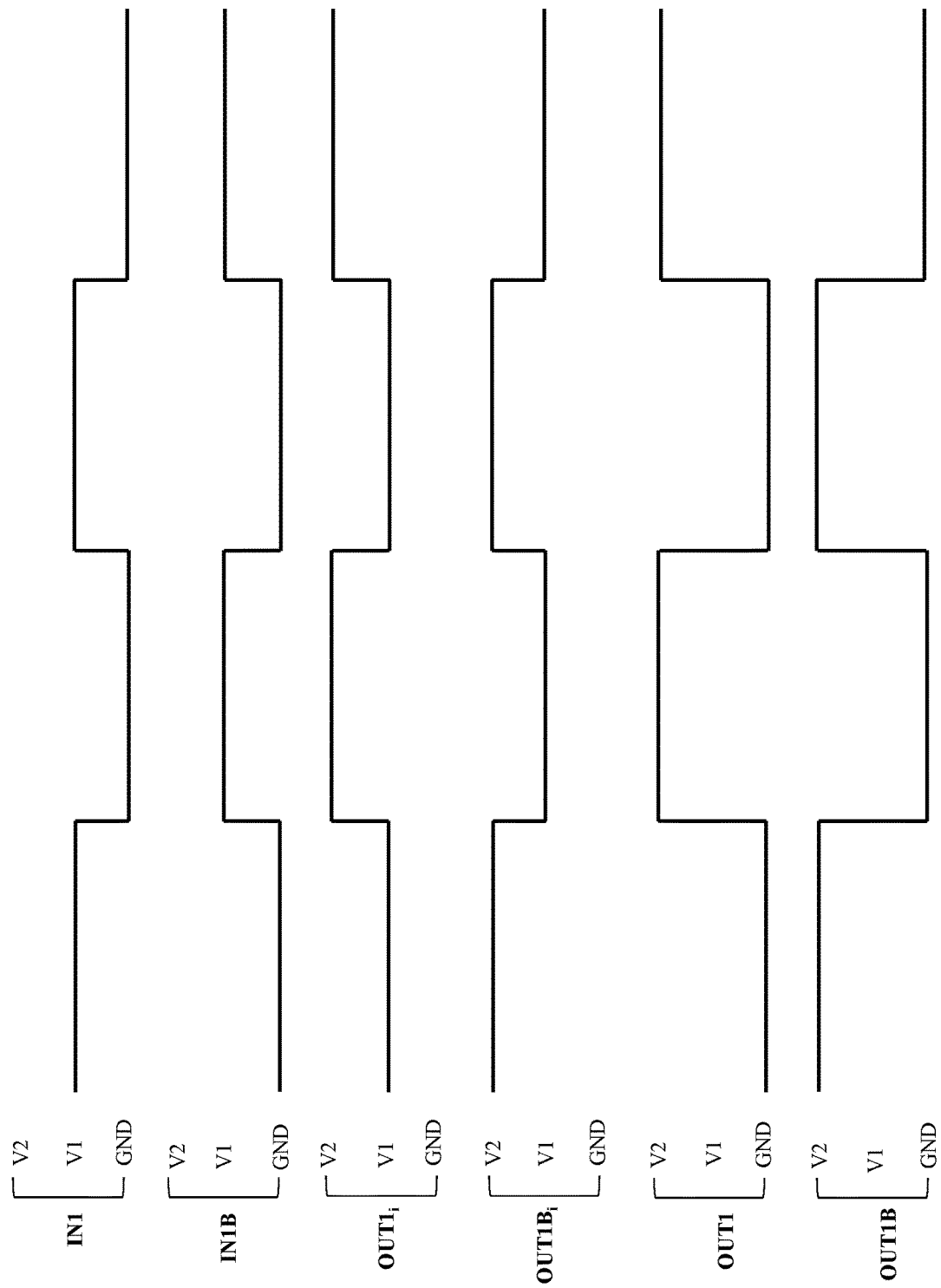
FIG. 3 is a timing diagram illustrating input voltage pulses to and output voltage pulses from the structure of FIGS. 1 and 2.

FIG. 3 shows an example of a timing diagram illustrating input voltage pulses IN1, IN1B to and output voltage pulses $OUT1_i$, $OUT1B_i$, OUT1, OUT1 from a circuit structure 100, where the maximum voltage rating of all of the transistors 110a-110b, 120a-120b, 130a-130b, and 140a-140b is 1.8V. That is, max VGS=1.8V, max VDS=1.8V, max VGD=1.8V. Thus, V1 is 1.8V and V2 is 2*1.8V or 3.6V. Additionally, the rising (0 to 1.8V) and falling (1.8 to 0V) edges of IN1 at input node 145a will be synchronized with the falling (1.8 to 0V) and rising (0 to 1.8V) edges of IN1B at input node 145b.

In operation, V1 (which is equal to the maximum voltage rating (VDDW) of the transistors) is continuously applied to gates 142a, 142b of NFETs 140a, 140b and gates 132a, 132b of third PFETs 130a, 130b. When IN1 transitions from ground to V1 and IN1B transitions from V1 to ground, in branch 101b, gate and source voltages of NFET 140b are at V1 and ground, respectively, so the threshold voltage (VT) of NFET 140b is reached. NFET 140b turns on and pulls down the voltage on final output node 135b to ground so OUT1 is at ground. When the voltage on final output node 135b is at ground, gate voltage on first PFET 110b is at ground and the VT of first PFET 110b is reached. First PFET 110b turns on, pulling down the voltage at intermediate output node 125b to V1 so $OUT1_i$ is at V1. The gate and source voltages on third PFET 130b are both at V1, so third PFET 130b remains off. In branch 101a the gate voltage on second PFET 120a is at V1 and the source voltage is at V2, so the VT of second PFET 120a is reached. Second PFET 120a turns on, thereby pulling up the voltage on intermediate output node 125a to V2 so $OUT1B_i$ goes to V2. When intermediate output node 125a is at V2, the second PFET 120b remains off. Furthermore, the gate and source voltages on third PFET 130a are V1 and V2, respectively, so the VT of third PFET 130a is reached. Third PFET 130a turns on, pulling up the voltage on final output node 135a to V2 so OUT1B goes to V2. Third PFET 130a also pulls the gate voltage of first PFET 110a up to V2, so first PFET 110a remains off. Since the gate and source voltages of NFET 140a are both at V1, NFET 140a also remains off.

When IN1 transitions from V1 to ground and IN1B transitions from ground to V1, the reverse occurs. In branch 101a, gate and source voltages on NFET 140a are at V1 and ground, respectively, so the VT of NFET 140a is reached. NFET 140a turns on and pulls down the voltage on final output node 135a to ground so OUT1B is at ground. When the voltage on final output node 135a is ground, the gate voltage on first PFET 110a is at ground and the VT of first PFET 110a is reached. First PFET 110a turns on, pulling down the voltage at intermediate output node 125a to V1 so OUT1B$_i$ is at V1. The gate and source voltages of third PFET 130a are both at V1, so third PFET 130a remains off. Additionally, in branch 101b the gate voltage on second PFET 120b is at V1 and the source voltage is at V2, so the VT of second PFET 120b is reached. Second PFET 120b turns on, thereby pulling up the voltage on intermediate output node 125b to V2 so OUT1$_i$ goes to V2. When intermediate output node 125b is at V2, second PFET 120a remains off. Furthermore, the gate and source voltages on third PFET 130b are V1 and V2, respectively, so the VT of third PFET 130b is reached. Third PFET 130b turns on, pulling up the voltage on final output node 135b to V2 so OUT1 goes to V2. Third PFET 130b also pulls up the gate voltage on first PFET 110b to V2, so first PFET 110b remains off. Since the gate and source voltages on NFET 140b are both at V1, NFET 140b also remains off.

Thus, as illustrated, OUT1$_i$ at intermediate output node 125b transitions between V1 and V2 and back (e.g., between 1.8V and 3.6V and back) and OUT1B$_i$ at intermediate output node 125a is inverted with respect to OUT1$_i$ (i.e., transitions from 3.6V to 1.8V when OUT1$_i$ transitions from 1.8V to 3.6V and vice versa). Additionally, OUT1 at final output node 135b transitions between ground and V2 and back (e.g., between 0V and 3.6V and back) and OUT1B at final output node 135a is inverted with respect to OUT1 (i.e., transitions from 3.6V to 0V when OUT1 transitions from 0V to 3.6V and vice versa). However, all of the transistors 110a-110b, 120a-120b, 130a-130b, 140a-140b are low voltage symmetric transistors and none of these transistors 110a-110b, 120a-120b, 130a-130b, 140a-140b operate above the maximum VGS. Thus, the transistors operate within the SOA.

As mentioned above, the circuit structure 100 can be a stand-alone single-stage voltage level shifter that operates to provide voltage level shifting up to V2 (i.e., to 2*V1). Alternatively, as discussed in greater detail below and illustrated generally in FIG. 4, this circuit structure 100 can be incorporated into another circuit structure and, more particularly, can be employed as the first voltage shifting stage of a multi-stage voltage level shifter 400 configured to further shift the voltage (e.g., to 3*V1, to 4*V1, etc.).

Referring to FIG. 4, also disclosed herein are embodiments of a multi-stage voltage level shifter 400 that incorporates the circuit structure 100, as described in detail above as a first voltage shifting stage (VS STAGE 1) and that includes one or more additional voltage shifting stages including a second voltage shifting stage 200 (VS STAGE 2) and, optionally, additional voltage shifting stages up to an nth stage (VS STAGE n).

The multi-stage voltage level shifter 400 can include multiple positive voltage rails. For a two-stage voltage level shifter, the positive voltage rails can include: the first voltage rail 191 at V1, which is equal to the maximum voltage rating (VDDW) of the transistors, and the second voltage rail 192, which is at V2, which is essentially double the magnitude of V1 (as discussed above); and a third voltage rail 292, which is at a third positive voltage (V3) that is essentially triple the magnitude of V1. For purposes of this disclosure, "essentially triple" the magnitudes refers to three times the magnitude, plus or minus 10% thereof (e.g., if V1 is 1.8V, then V3=5.4V+/−. 54V, etc.). Thus, for example, if the transistors are all 1.8V transistors, V1 of the first voltage rail 191 can be 1.8V, V2 of the second voltage rail 192 can be 3.6V, and V3 of the third voltage rail can be 5.4V. Alternatively, if the transistors are all 1.5V transistors, V1 of the first voltage rail 191 can be 1.5V, V2 of the second voltage rail 192 can be 3.0V, and V3 of the third voltage rail can be 4.5V. Alternatively, if the transistors are all 0.8V transistors, V1 of the first voltage rail 191 can be 0.8V, V2 of the second voltage rail 192 can be 1.6V, and V3 of the third voltage rail can be 2.4V.

As mentioned above, the configuration of VS STAGE 1 can be the same as that of the circuit structure 100 of FIGS. 1-2. Thus, VS STAGE 1 can receive two first input voltage pulses, including IN1 and IN1B, and can output four first output voltage pulses, including OUT1$_i$, OUT1B$_i$, OUT1, and OUT1B. VS STAGE 2 can be connected to the second voltage rail 192 (at V2=2*V1) and the third voltage rail 292 (at V3=3*V1). VS STAGE 2 can further be connected to receive the four first output voltage pulses (i.e., OUT1$_i$, OUT1B$_i$, OUT1, and OUT1B) from VS STAGE1, as inputs, and can be further configured to generate and output multiple second output voltage pulses and, particularly, six second output voltage pulses (which, as discussed in greater detail below, include a final second output voltage pulse (OUT2) that transitions between ground and V3).

Optionally, the multi-stage voltage level shifter 400 can include additional voltage shifting stages. For example, the multi-stage voltage level shifter 400 could further include a third voltage shifting stage 300 (VS STAGE 3). VS STAGE 3 can be connected to the third voltage rail 292 (at V3=3*V1) and to a fourth voltage rail (at V4=4*V1)). VS STAGE 3 can further be connected to receive, as inputs, the six second output voltage pulses from VS STAGE 2, and can be configured to generate and output multiple third output voltage pulses and, particularly, eight third output voltage pulses, which (as discussed in greater detail below) include a final third output voltage pulse (OUT3) that transitions between ground and V4. Optionally, the multi-stage voltage level shifter 400 can further include additional voltage shifting stages up to an nth stage. In the multi-stage voltage level shifter embodiments, each additional voltage shifting stage has a similar structure to the previous voltage shifting stage but adds four additional transistors (one PFET and one NFET to each of the two parallel branches) and further has two additional inputs and two additional outputs.

Figure 5:
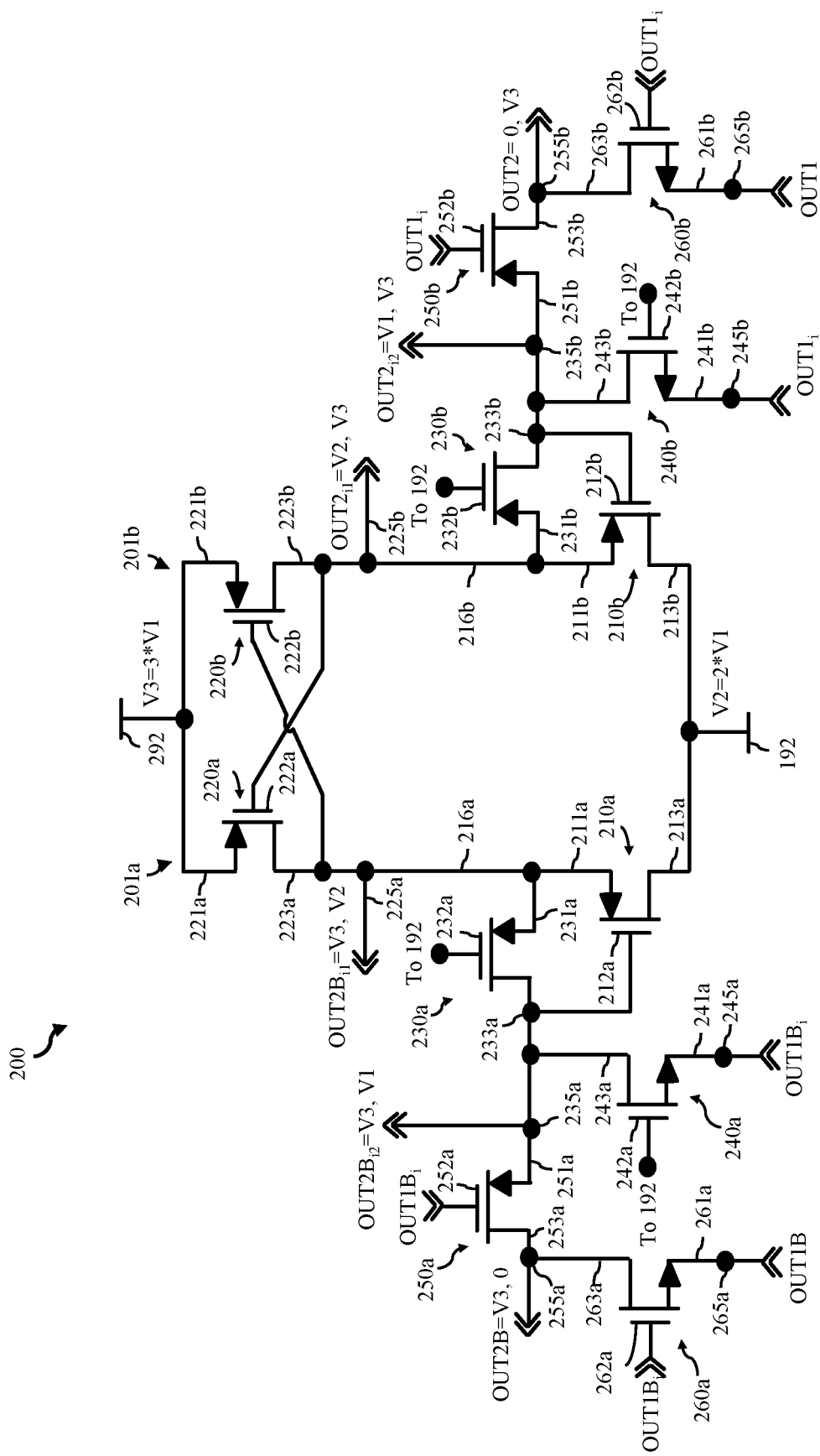
FIG. 5 is a schematic diagram illustrating in greater detail the second voltage shifting stage of the structure of FIG. 4.

FIG. 5 is schematic diagram illustrating an example of a second voltage shifting stage 200 (VS STAGE 2) that can be incorporated into the multi-stage voltage level shifter 400 of FIG. 4. As illustrated, the second voltage shifting stage 200 (VS STAGE 2) can be connected to the second voltage rail 192 (at V2=2*V1) and the third voltage rail 292 (at V3=3*V3). The configuration of the second voltage shifting stage 200 can be similar to that of VS STAGE 1 but with a total of twelve transistors instead of ten, as discussed below. Specifically, VS STAGE 2 can include symmetric branches 201a-201b connected in parallel between second voltage rail 192 and third voltage rail 292. Each branch 201a, 201b can include a first PFET 210a, 210b and a second PFET 220a, 220b connected in series between second voltage rail 192 and third voltage rail 292. That is, first PFET 210a, 210b can include a drain region 213a, 213b electrically connected to second voltage rail 192, a gate 212a, 212b, and a source region 211a, 211b. Second PFET 220a, 220b can include a drain region 223a, 223b electrically connected to source region 211a, 211b of first PFET 210a, 210b, a gate 222a, 222b, and a source region 221a, 221b electrically connected to third voltage rail 292.

Each branch 201a, 201b can further include an intermediate output node 225a, 225b and a third PFET 230a, 230b electrically connected to a junction 216a, 216b between first PFET 210a, 210b and the second PFET 220a, 220b. Third PFET 230a, 230b can specifically include: a source region 231a, 231b, which is electrically connected to junction 216a, 216b between first PFET 210a, 210b and second PFET 220a, 220b; a drain region 233a, 233b, which is electrically connected to another intermediate output node 235a, 235b and also to gate 212a, 212b of first PFET 210a, 210b, and a gate 232a, 232b, which is electrically connected to, e.g., the second voltage rail 192, so as to receive V2.

Each branch 201a, 201b can further include a first NFET 240a, 240b (also referred to herein as a first pass-gate NFET). First NFET 240a, 240b can include: a source region 241a, 241b, which is electrically connected to an intermediate input node 245a, 245b; a drain region 243a, 243b, which is electrically connected to the intermediate output node 235a, 235b (and thereby electrically connected to the drain region 233a, 233b of third PFET 230a, 230b as well as gate 212a, 212b of first PFET 210a, 210b), and a gate 242a, 242b, which is electrically connected, e.g., to the second voltage rail 192, to receive V2. The intermediate input node 245a can be connected to receive, as an input, OUT1B$_i$ from the VS STAGE 1 and intermediate input node 245b can be connected to receive, as an input, OUT1$_i$ from the VS STAGE 1. As discussed above, OUT1$_i$ transitions between V1 and V2 and OUT1B$_i$ is inverted with respect to OUT1$_i$.

Each branch 201a, 201b can further include a final output node 255a, 255b and a fourth PFET 250a, 250b electrically connected in series between third PFET 230a, 230b and the final output node 255a, 255b. Fourth PFET 250a, 250b can specifically include: a source region 251a, 251b, which is electrically connected to the intermediate output node 235a, 235b; a drain region 253a, 253b, which is electrically connected to the final output node 255a, 255b, and a gate 252a, 252b. Gate 252a of fourth PFET 250a in branch 201a can specifically be connected to the intermediate input node 245a to receive, as an input, OUT1B$_i$ from VS STAGE 1, whereas gate 252b of fourth PFET 250b in branch 201b can specifically be connected to the intermediate input node 245b to receive, as an input, OUT1$_i$ from VS STAGE 1. As discussed above, OUT1$_i$ transitions between V1 and V2 and OUT1B$_i$ is inverted with respect to OUT1$_i$.

Each branch 201a, 201b can further include a second NFET 260a, 260b (also referred to herein as a second pass-gate NFET). Second NFET 260a, 260b can include: a source region 261a, 261b, which is electrically connected to input node 265a, 265b; a drain region 263a, 263b, which is electrically connected to the final output node 255a, 255b (and thereby electrically connected to the drain region 253a, 253b of fourth PFET 250a, 250b); and a gate 262a, 262b. Gate 262a of second NFET 260a can specifically be connected to receive OUT1B$_i$ from the intermediate input node 245a and gate 262b of second NFET 260b can specifically be connected to receive OUT1$_i$ from intermediate input node 245b. Furthermore, the input node 265a can be connected to receive, as an input, OUT1B from VS STAGE 1 and input node 265b can be connected to receive, as an input, OUT1 from VS STAGE 1. As discussed above, OUT1 transitions between ground and V2 and OUT1B is inverted with respect to OUT1.

The second PFET 220a of branch 201a and second PFET 220b of branch 201b can be cross coupled. That is, gate 222a of second PFET 220a in branch 201a can be electrically connected to junction 216b between first PFET 210b and second PFET 220b in branch 201b, while gate 222b of second PFET 220b in branch 201b can be electrically connected to junction 216a between first PFET 210a and second PFET 220a in branch 201a.

Figure 6A:
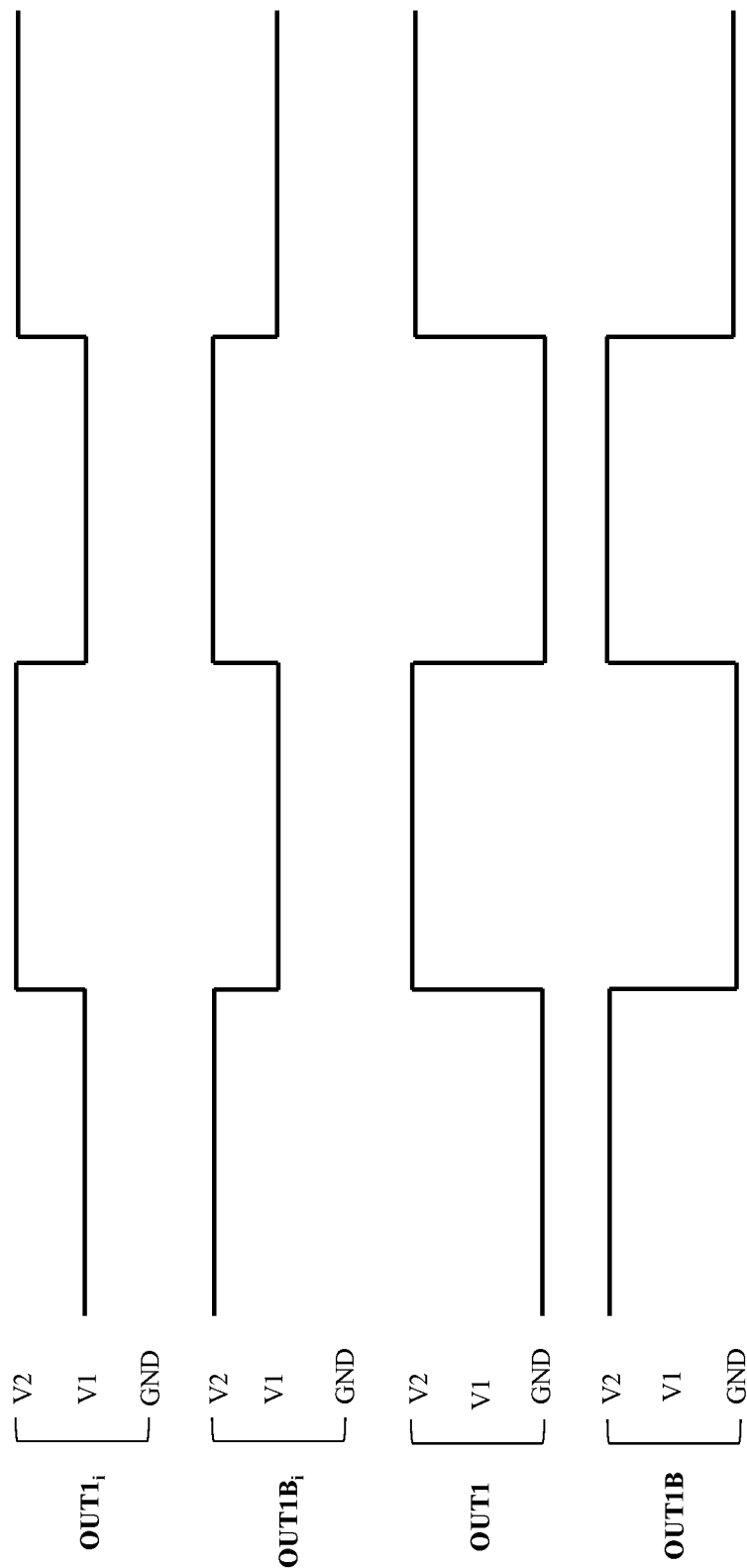
Figure 6C:
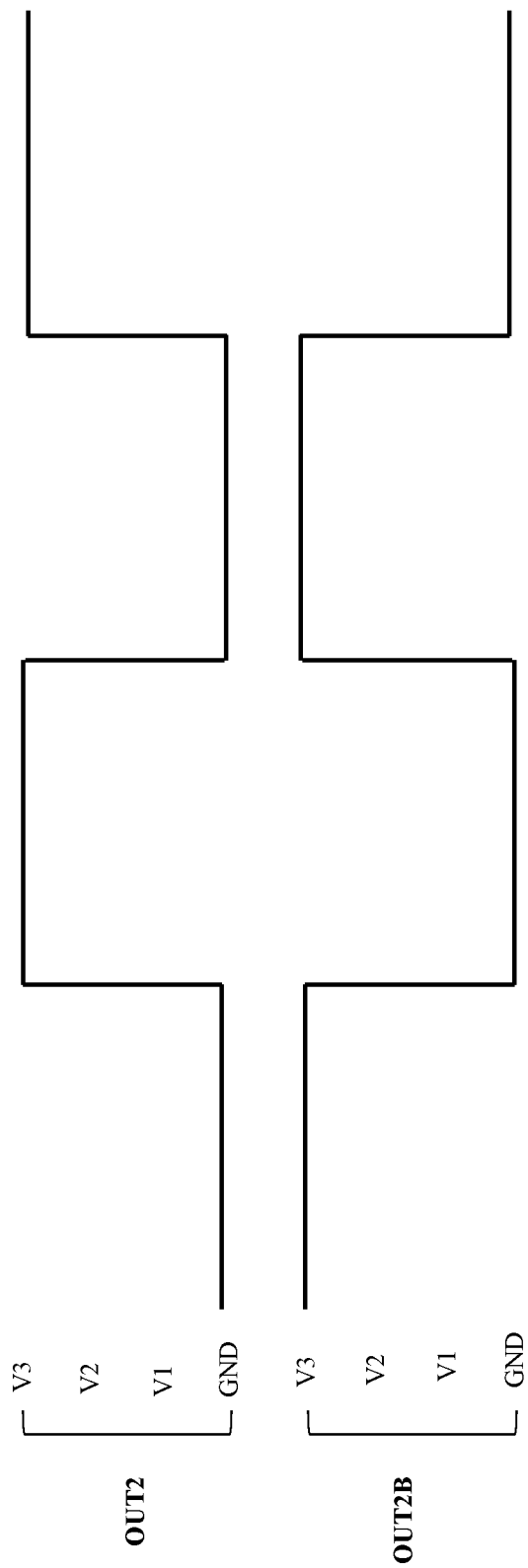

FIGS. 6A-6C show an example of a timing diagram illustrating various voltage pulses, as described in greater detail below, into to and output from VS STAGE 2 (e.g., configured as illustrated in FIG. 5) of a multi-stage voltage level shifter 400 (e.g., as shown in FIG. 4), particularly, where the maximum voltage rating of all of the transistors in the multi-stage voltage level shifter 400 is 1.8V. That is, max VGS=1.8V, max VDS=1.8V, max VGD=1.8V. Thus, V1 is 1.8V, V2 is 2*1.8V or 3.6V, and V3 is 5.4V.

FIG. 6A specifically shows the four first output voltage pulses OUT1$_i$, OUT1B$_i$, OUT1, and OUT1B, which are generated and output by VS STAGE 1, and which are received, as inputs, by VS STAGE 2. As discussed in detail above and illustrated in the figures, OUT1$_i$ transitions between V1 and V2, OUT1B$_i$ is inverted with respect to OUT1$_i$, OUT1 transitions between ground and V2, and OUT1B is inverted with respect to OUT1.

FIG. 6B specifically shows four intermediate second output voltage pulses generated and output by VS STAGE 2 in response to the voltage pulses received from VS STAGE 1. These intermediate second output voltage pulses include: intermediate second output voltage pulse (OUT2$_{i1}$) generated and output at intermediate output node 225b in branch 201b, inverted intermediate second output voltage pulse (OUT2B$_{i1}$) generated and output at intermediate output node 225a in branch 201a, additional intermediate second output voltage pulse (OUT2$_{i2}$) generated and output at intermediate output node 235b in branch 201b, and inverted additional intermediate second output voltage pulse (OUT2B$_{i2}$) generated and output at intermediate output node 235b in branch 201b. As indicated, OUT2$_{i1}$ transitions between V2 and V3, OUT2B$_{i1}$ is inverted with respect to OUT2$_{i1}$ (i.e., transitions from V3 to V2 when OUT2$_{i1}$ transitions from V3 to V2 and vice versa), OUT2$_{i2}$ transitions between V1 and V3, and OUT2B$_{i2}$ is inverted with respect to OUT2$_{i2}$ (i.e., transitions from V3 to V1 when OUT2$_{i2}$ transitions from V1 to V3 and vice versa).

FIG. 6C specifically shows two final second output voltage pulses generated and output by VS STAGE 2 including: final second output voltage pulse (OUT2) generated and output at final output node 255b in branch 201b and inverted final second output voltage pulse (OUT2B) generated and output at final output node 255a in branch 201a. As indicated, OUT2 transitions between ground and V3, and OUT2B is inverted with respect to OUT2 (i.e., transitions from V3 to ground when OUT2 transitions from ground to V3 and vice versa).

Referring again to FIG. 4, optionally, a multi-stage voltage level shifter 400 could include one or more additional voltage shifting stages. As mentioned above, in the multi-stage voltage level shifter embodiments, each additional voltage shifting stage will be connected between the high voltage rail from the previous voltage shifting stage and a next higher voltage rail. Each additional voltage shifting stage is structured similarly to the previous voltage shifting stage but with an additional voltage rail, four additional transistors (one PFET and one NFET to each branch) and has two additional inputs and two additional outputs.

For example, in a three-stage voltage level shifter, VS STAGE 1 will be connected to the first and second voltage rails at V1 and V2, respectively, and VS STAGE 2 will be connected to the second and third voltage rails at V2 and V3, respectively. The third voltage shifting stage 300 (VS STAGE 3) will further be connected to the third voltage rail at V3 and a fourth voltage rail at a fourth positive voltage level (V4) that is four times V1. Thus, for example, if the transistors are all 1.8V transistors, V1 of the first voltage rail 191 is 1.8V, V2 of the second voltage rail 192 is 3.6V, V3 of the third voltage rail is 5.4V, and V4 of the fourth voltage rail will be 7.2V. Alternatively, if the transistors are all 1.5V transistors, V1 of the first voltage rail 191 will be 1.5V, V2 of the second voltage rail 192 will be 3.0V, V3 of the third voltage rail will be 4.5V, and V4 of the fourth voltage rail will be 6.0V. Alternatively, if the transistors are all 0.8V transistors, V1 of the first voltage rail 191 will be 0.8V, V2 of the second voltage rail 192 will be 1.6V, V3 of the third voltage rail will be 2.4V, and V4 of the fourth voltage rail will be 3.2V.

The configuration of VS STAGE 3 can be similar to that of VS STAGE 2 except that in each branch of VS STAGE 3 the drain regions of the second NFET and the fourth PFET would be connected to another intermediate output node, a fifth PFET would be electrically connected in series between the fourth PFET and the final output node, and a third NFET would also be electrically connected to the final output node. The third voltage shifting stage would receive, as inputs, the six second output voltage pulses from VS STAGE 2 (as discussed above and would generate and output eight third output voltage pulses, as illustrated, including a final third output voltage (OUT3), which transitions between ground and V4, and an inverted final third output voltage (OUT3B), which is inverted with respect to OUT3 (i.e., transitions from V4 to ground when OUT3 transitions from ground to V4 and vice versa).

In the single-stage and multi-stage voltage level shifters disclosed herein and illustrated in the figures, all transistors (in all stages) can have the same maximum voltage rating and, for reduced power consumption, that maximum voltage rating (VDDW) can be relatively low, as specified by the transistor data sheet (e.g., a maximum voltage rating of 3.3 volts (V) or lower, such as 1.8V, 1.5V or 0.8V). To minimize manufacturing complexity, the transistors can also all be symmetric. That is, they can be designed so that the source region and the drain region are essentially the same (e.g., same size, same doping, separated from the gate by the same distance, etc.) except for minor process variations and so that the same maximum voltage rating applies to the gate-source voltage (VGS), the gate-drain voltage (VGD), and the drain-source voltage (VDS). Furthermore, given the unique configuration of each stage (e.g., including the cross-coupled PFETs and input voltage pulses on source regions of NFET pass-gate transistors, etc.), voltage level shifting is achieved without violating any of the maximum voltage rating to avoid device stress and ensuring operation within the SOA. Furthermore, stack power consumption is minimized because there is no direct path between the power supply and ground and no additional biasing circuitry is required.

The above-described embodiments including the single-stage voltage level shifter and the multi-stage voltage level shifter can, for example, be incorporated into any circuit requiring the use of a variety of different voltage pulses (e.g., for generation of different clock signals, different control signals, etc.).

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first voltage rail at a first positive voltage;
   a second voltage rail at a second positive voltage that is higher than the first positive voltage; and
   a voltage level shifter including a first branch and a second branch connected to the first voltage rail and the second voltage rail,
   wherein the first branch and the second branch each include: at least a P-type transistor and an N-type transistor electrically connected in series; an intermediate output node at a source region of the P-type transistor, a final output node at drain regions of the P-type transistor and the N-type transistor; and an input node at a source region of the N-type transistor,
   wherein the input node of the first branch receives an input voltage pulse that transitions between the first positive voltage and ground and the input node of the second branch receives an inverted input voltage pulse, and
   wherein the intermediate output node in the second branch outputs an intermediate output voltage pulse that transitions between the first positive voltage and the second positive voltage, the final output node in the second branch outputs a final output voltage pulse that transitions between ground and the second positive voltage, the intermediate output node in the first branch outputs an inverted intermediate output voltage pulse, and the final output node in the first branch outputs an inverted final output voltage pulse.

2. The structure of claim 1,
wherein the voltage level shifter further includes multiple transistors,
wherein the multiple transistors have the same voltage rating equal to the first positive voltage, and
wherein the second positive voltage is double the first positive voltage.

3. The structure of claim 2, wherein the multiple transistors are symmetric transistors.

4. The structure of claim 1, wherein the first positive voltage is 3.3 volts or less.

5. The structure of claim 1, wherein the first positive voltage is one of 1.8 volts, 1.5 volts, and 0.8 volts.

6. The structure of claim 1,
wherein a gate of the N-type transistor is connected to receive the first positive voltage.

7. The structure of claim 6, wherein the first branch and the second branch each further include:
a first P-type transistor; and
a second P-type transistor, wherein the first P-type transistor and the second P-type transistor are connected in series between the first voltage rail and the second voltage rail, and
wherein the intermediate output node is at a junction between the first P-type transistor and the second P-type transistor,
wherein a gate of the first P-type transistor is electrically connected to the final output node and to the drain regions of the P-type transistor and the N-type transistor, and
wherein, between the first branch and the second branch, second P-type transistors are cross-coupled.

8. A structure comprising:
first voltage rail at a first positive voltage;
a second voltage rail at a second positive voltage that is higher than the first positive voltage; and
a voltage level shifter connected to the first voltage rail and the second voltage rail,
wherein the voltage level shifter includes two input nodes; two N-type transistors having source regions connected to the input nodes, respectively, and further having gates connected to receive the first positive voltage; and four output nodes,
wherein the voltage level shifter receives two input voltage pulses at the input nodes, respectively, and outputs four output voltage pulses at the output nodes, respectively,
wherein the two input voltage pulses include: an input voltage pulse that transitions between the first positive voltage and ground; and an inverted input voltage pulse,
wherein the four output voltage pulses include: an intermediate output voltage pulse that transitions between the first positive voltage and the second positive voltage; an inverted intermediate output voltage pulse; a final output voltage pulse that transitions between ground and the second positive voltage; and an inverted final output voltage pulse,
wherein the voltage level shifter further includes multiple transistors,
wherein the multiple transistors have the same voltage rating equal to the first positive voltage, and
wherein the second positive voltage is essentially double the first positive voltage.

9. The structure of claim 8, wherein the multiple transistors are symmetric transistors.

10. The structure of claim 8, wherein the first positive voltage is 3.3 volts or less.

11. The structure of claim 8, wherein the first positive voltage is one of 1.8 volts, 1.5 volts, and 0.8 volts.

12. The structure of claim 8,
wherein the voltage level shifter includes two branches, wherein each branch includes:
a first P-type transistor;
a second P-type transistor, wherein the first P-type transistor and the second P-type transistor are connected in series between the first voltage rail and the second voltage rail;
an intermediate output node at a junction between the first P-type transistor and the second P-type transistor; and
a third P-type transistor having a source region connected to the junction, a gate connected to receive the first positive voltage, and a drain region connected to an output node, to a drain region of a N-type transistor, and to a gate of the first P-type transistor, and
wherein, between the two branches, second P-type transistors are cross-coupled.

13. A structure comprising:
multiple voltage rails including at least: a first voltage rail at a first positive voltage; a second voltage rail at a second positive voltage that is higher than the first positive voltage; and a third voltage rail at a third positive voltage that is higher than the second positive voltage; and
a voltage level shifter including multiple voltage shifting stages including at least:
a first voltage shifting stage connected to the first voltage rail and the second voltage rail, wherein the first voltage shifting stage receives multiple first input voltage pulses and outputs multiple first output voltage pulses, wherein the multiple first input voltage pulses include a first input voltage pulse that transitions between the first positive voltage and ground, and wherein the multiple first output voltage pulses include an intermediate first output voltage pulse that transitions between the first positive voltage and the second positive voltage and a final first output voltage pulse that transitions between ground and the second positive voltage; and
a second voltage shifting stage connected to the second voltage rail and the third voltage rail, wherein the second voltage shifting stage receives the multiple first output voltage pulses and outputs multiple second output voltage pulses, and wherein the multiple second output voltage pulses include at least an intermediate second output voltage pulse that transitions between the second positive voltage and the third positive voltage, an additional intermediate second output voltage pulse that transitions between the first positive voltage and the third positive voltage, and a final second output voltage pulse that transitions between ground and the third positive voltage.

14. The structure of claim 13,
wherein the voltage level shifter further includes multiple transistors, wherein the multiple transistors are symmetric transistors with the same voltage rating equal to the first positive voltage,
wherein the second positive voltage is essentially double the first positive voltage, and
wherein the third positive voltage is essentially triple the first positive voltage.

15. The structure of claim 13, wherein the first positive voltage is 3.3 volts or less.

16. The structure of claim 13, wherein the first positive voltage is one of 1.8 volts, 1.5 volts, and 0.8 volts.

17. The structure of claim 13,
wherein the first voltage shifting stage further includes:
two first input nodes receiving the multiple first input voltage pulses, respectively, wherein the multiple first input voltage pulses include the first input voltage pulse and an inverted first input voltage pulse; and
four first output nodes outputting the multiple first output voltage pulses, respectively, wherein the multiple first output voltage pulses include the final first output voltage pulse, an inverted final first output voltage pulse, the intermediate first output voltage pulse, and an inverted intermediate first output voltage pulse, and wherein the second voltage shifting stage further includes:
four second input nodes receiving the multiple first output voltage pulses, respectively; and
six second output nodes outputting the multiple second output voltage pulses, respectively, wherein the multiple second output voltage pulses include the final second output voltage pulse, an inverted final second output voltage pulse, the intermediate second output voltage pulse, an inverted intermediate second output voltage pulse, the additional intermediate second output voltage pulse, and an inverted additional intermediate second output voltage pulse.

18. The structure of claim 13, wherein the second voltage shifting stage includes four more transistors than the first voltage shifting stage.

* * * * *